(12) United States Patent
Kilian et al.

(10) Patent No.: US 11,874,325 B2
(45) Date of Patent: Jan. 16, 2024

(54) INTEGRATED CIRCUIT, TEST ASSEMBLY AND METHOD FOR TESTING AN INTEGRATED CIRCUIT

(71) Applicant: Infineon Technologies AG, Neubiberg (DE)

(72) Inventors: Tobias Kilian, Munich (DE); Martin Huch, Munich (DE); Heiko Ahrens, Neubiberg (DE); Daniel Tille, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/944,239

(22) Filed: Sep. 14, 2022

(65) Prior Publication Data

US 2023/0079599 A1 Mar. 16, 2023

(30) Foreign Application Priority Data

Sep. 15, 2021 (DE) .................... 10 2021 123 889.7

(51) Int. Cl.
  *G01R 31/3185* (2006.01)
(52) U.S. Cl.
  CPC ........... *G01R 31/318536* (2013.01); *G01R 31/31858* (2013.01); *G01R 31/318541* (2013.01);
  (Continued)
(58) Field of Classification Search
  CPC .... G01R 31/318536; G01R 31/318541; G01R 31/318555; G01R 31/31858; G01R 31/318583
  (Continued)

(56) References Cited

U.S. PATENT DOCUMENTS

| 5,909,453 A | * | 6/1999 | Kelem ........... G01R 31/318541 365/201 |
| 6,105,153 A | | 8/2000 | Yamada |

(Continued)

FOREIGN PATENT DOCUMENTS

DE 10138556 C1 6/2003

OTHER PUBLICATIONS

X. Wang, M. Tehranipoor and R. Datta, "Path-RO: A novel on-chip critical path delay measurement under process variations," 2008 IEEE/ACM International Conference on Computer-Aided Design, 2008, pp. 640-646, doi: 10.1109/ICCAD.2008.4681644.

(Continued)

*Primary Examiner* — John J Tabone, Jr.
(74) *Attorney, Agent, or Firm* — Eschweiler & Potashnik, LLC (57) ABSTRACT

One exemplary embodiment describes an integrated circuit, comprising a multiplicity of scan flip-flops, a multiplicity of ring oscillator circuits, wherein each ring oscillator circuit comprises a chain of logic gates comprising a plurality of logic gates connected in succession, an input multiplexer for the chain, and a feedback line from an output connection of the last logic gate of the chain to a data input connection of the input multiplexer. Each ring oscillator circuit is assigned a scan flip-flop group that contains at least one of the multiplicity of scan flip-flops. The input multiplexer of the ring oscillator circuit is controlled depending on a control bit stored by the at least one scan flip-flop of the scan flip-flop group assigned to the ring oscillator circuit such that the input multiplexer outputs an output bit fed back via the feedback line to the first logic gate of the chain or that the input multiplexer outputs a input bit that is to be processed by the chain to the first logic gate of the chain. The ring (Continued)

oscillator circuits are assigned different scan flip-flop groups.

20 Claims, 8 Drawing Sheets

(52) U.S. Cl.
CPC ............... *G01R 31/318555* (2013.01); *G01R 31/318583* (2013.01)

(58) Field of Classification Search
USPC ........................................ 714/726, 729, 728
See application file for complete search history.

(56) References Cited

U.S. PATENT DOCUMENTS

| | | | |
|---|---|---|---|
| 7,039,842 B1 * | 5/2006 | Whitten ............. | G01R 31/3016 714/745 |
| 7,567,136 B2 * | 7/2009 | Osvaldella ............ | H03K 5/133 331/177 R |
| 8,560,980 B2 | 10/2013 | Xiong et al. | |
| 8,819,615 B2 | 8/2014 | Le Coz et al. | |
| 9,081,991 B2 | 7/2015 | Jyothi et al. | |
| 9,501,604 B1 | 11/2016 | More et al. | |
| 9,983,262 B1 * | 5/2018 | Trock ................ | G01R 31/31853 |
| 2003/0030461 A1 | 2/2003 | Oberle et al. | |
| 2005/0248415 A1 * | 11/2005 | Osvaldella ............ | H03K 5/133 331/57 |
| 2013/0125073 A1 * | 5/2013 | Bickford .......... | G01R 31/31726 716/108 |
| 2014/0132290 A1 | 5/2014 | Charlebois et al. | |
| 2015/0128001 A1 * | 5/2015 | Raina ............ | G01R 31/31707 714/726 |
| 2021/0281248 A1 | 9/2021 | DeForge et al. | |
| 2023/0079599 A1 * | 3/2023 | Kilian ............ | G01R 31/318583 714/726 |
| 2023/0138651 A1 * | 5/2023 | Kilian ................. | H03K 3/0315 714/726 |

OTHER PUBLICATIONS

X. Wang, M. Tehranipoor and R. Datta, "A novel architecture for on-chip path delay measurement," 2009 International Test Conference, 2009, pp. 1-10, doi: 10.1109/TEST.2009.5355742.

\* cited by examiner

INTEGRATED CIRCUIT, TEST ASSEMBLY AND METHOD FOR TESTING AN INTEGRATED CIRCUIT

REFERENCE TO RELATED APPLICATIONS

This application claims priority to German Patent Application 10 2021 123 889.7, filed on Sep. 15, 2021. The contents of the above-referenced Patent Application is hereby incorporated by reference in its entirety.

TECHNICAL FIELD

Exemplary embodiments relate generally to integrated circuits, test assemblies and methods for testing integrated circuits.

SUMMARY

Integrated circuits, for example microcontrollers (MCUs) such as for vehicles, for instance, have to meet high quality standards. Because of this, they are tested extensively. One area of testing is performance screening. The performance of an integrated circuit is in this case the maximum clock frequency of the integrated circuit in the worst case (that is to say worst-case conditions). A circuit (for example a chip) that does not pass the performance screening is typically eliminated.

However, the performance, for example of a microcontroller, depends on many device parameters and environmental conditions. For a direct performance measurement, a comprehensive test at system level would be required in order to test each case of application in which the microcontroller is used. However, microcontrollers are mass-produced products with a high cost pressure, while the test system level is associated with a high degree of outlay and huge test costs.

Therefore, test structures are conventionally used to measure the performance indirectly. If an indirect measurement is used to determine a parameter (such as the performance here), the accuracy of the measurement depends greatly on the quality of the test structures. A type of test structure that can be used to achieve a high degree of accuracy is a ring oscillator (RO), in particular a functional ring oscillator that is formed from gates present in the integrated circuit for the normal functioning thereof. In this case, suitable side inputs for the gates of scan flip-flops are supplied, the side inputs being provided in the integrated circuit (for example to carry out other test and for normal operation) in order that the gates form a logic path.

However, the implementation of ring oscillators (even functional ring oscillators) in high numbers in an undivided circuit typically leads to considerable overhead, in particular routing outlay. Therefore, more efficient approaches to testing the performance of integrated circuits are desirable.

One exemplary embodiment provides an integrated circuit, comprising a multiplicity of scan flip-flops, a multiplicity of ring oscillator circuits, wherein each ring oscillator circuit comprises a chain of logic gates comprising a plurality of logic gates connected in succession, an input multiplexer for the chain, and a feedback line from an output connection of the last logic gate of the chain to a data input connection of the input multiplexer, wherein each ring oscillator circuit is assigned a scan flip-flop group that contains at least one of the multiplicity of scan flip-flops, wherein the input multiplexer of the ring oscillator circuit is controlled depending on a bit stored by the at least one scan flip-flop of the scan flip-flop group assigned to the ring oscillator circuit in such a way that the input multiplexer outputs the bit fed back via the feedback line to the first logic gate of the chain or that the input multiplexer outputs a bit that is to be processed by the chain to the first logic gate of the chain, and wherein the ring oscillator circuits are assigned different scan flip-flop groups.

Further embodiments provide a test assembly and a method for testing an integrated circuit as described above.

BRIEF DESCRIPTION OF THE DRAWINGS

The figures do not represent the actual scales but are intended to used to illustrate the principles of the various exemplary embodiments. Various exemplary embodiments are described in detail below with reference to the following figures.

DESCRIPTION

The following detailed description relates to the appended figures, the details and exemplary embodiments. These exemplary embodiments are described in detail so that a person skilled in the art can execute the disclosure. Other embodiments are also possible and the exemplary embodiments can be changed in structural, logic and electrical terms without departing from the subject matter of the disclosure. The various exemplary embodiments are not necessarily mutually exclusive but various embodiments can be combined with one another to produce new embodiments. Within the scope of this description, the terms "linked," "connected," and "coupled" are used to describe both a direct and an indirect link, a direct or indirect connection, and direct or indirect coupling.

Figure 1:
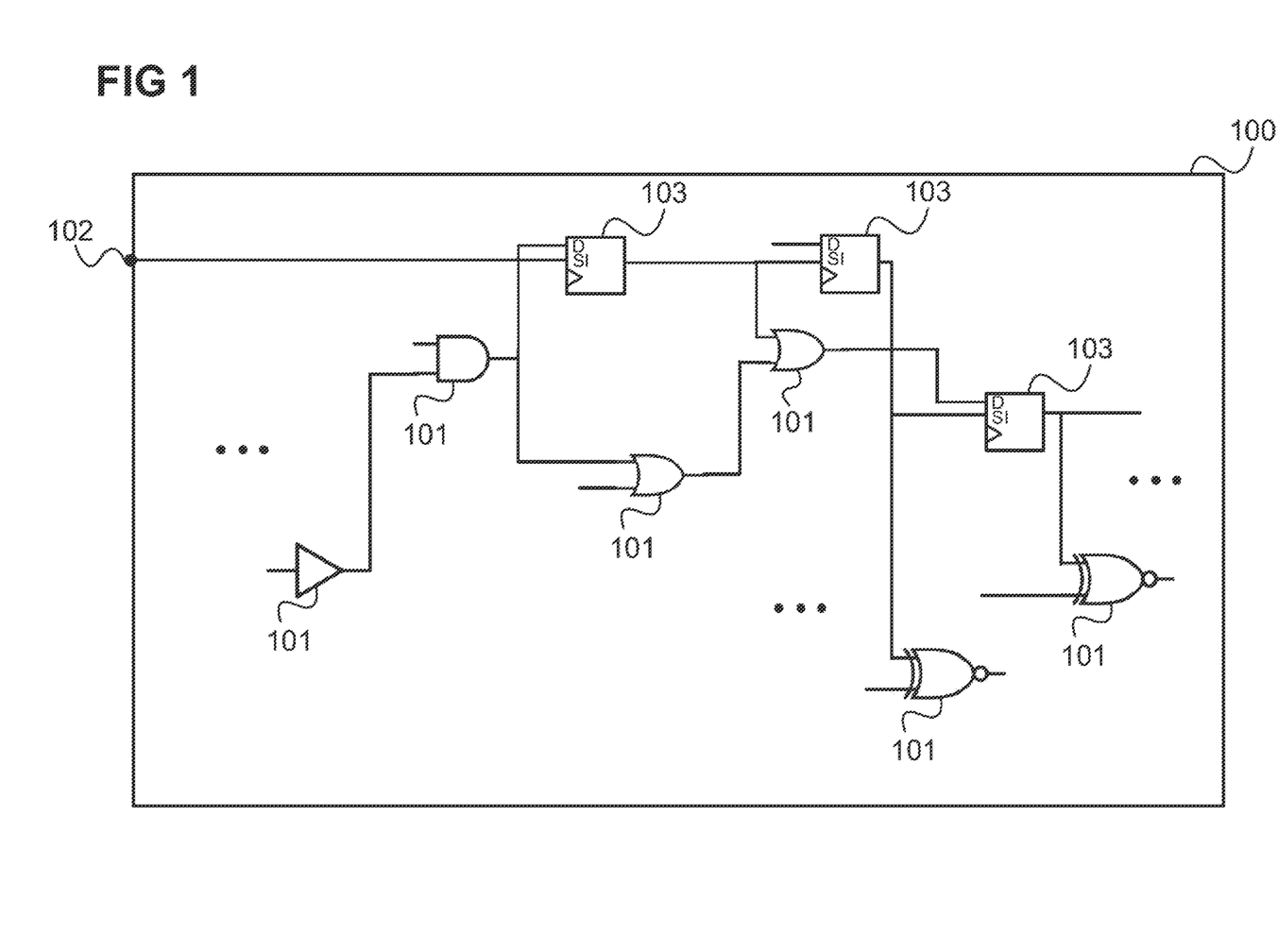
FIG. 1 shows an integrated circuit (or a chip) according to one embodiment.

FIG. 1 shows an integrated circuit (or a chip) 100 according to one embodiment.

By way of example, the integrated circuit 100 is a microcontroller, for example for an ECU (electronic control unit) in a vehicle or else a chip card module for a chip card of any form factor.

As is typically the case, the integrated circuit 100 comprises a multiplicity of logic gates 101 (AND gates, NOR gates, exclusive OR gates, inverters, etc.) that are connected to one another via connecting elements. The logic gates 101 are cells from a chip design library and they may also be more complex circuits (for example complex gates).

The integrated circuit also comprises flip-flops 103 that are connected to the logic gates 101. At least a portion of the flip-flops 103 are provided as scan flip-flops in order to be able to load test patterns for testing the integrated circuit into the scan flip-flops. A scan flip-flop is a D flip-flop with a multiplexer added at the input connection, wherein an input connection of the multiplexer functions as functional input connection D and the other input connection is used as scan-in input connection (SI). The test pattern is pushed into the flip-flops 103 (in each case via the scan-in input connection) for example by way of one or more test input pins 102. A scan enable signal (or test enable signal, not shown in FIG. 1) switches the multiplexer of the scan flip-flop for the testing from the data input connection (D) to the scan-in input connection (SI). The scan enable signal is a general signal that is the same for all scan flip-flops (it therefore does not need to be routed separately).

One possibility for measuring the performance is to use a chain of logic gates 101 (or generally cells) that are already present in the integrated circuit 100 to form a ring oscillator.

Figure 2:
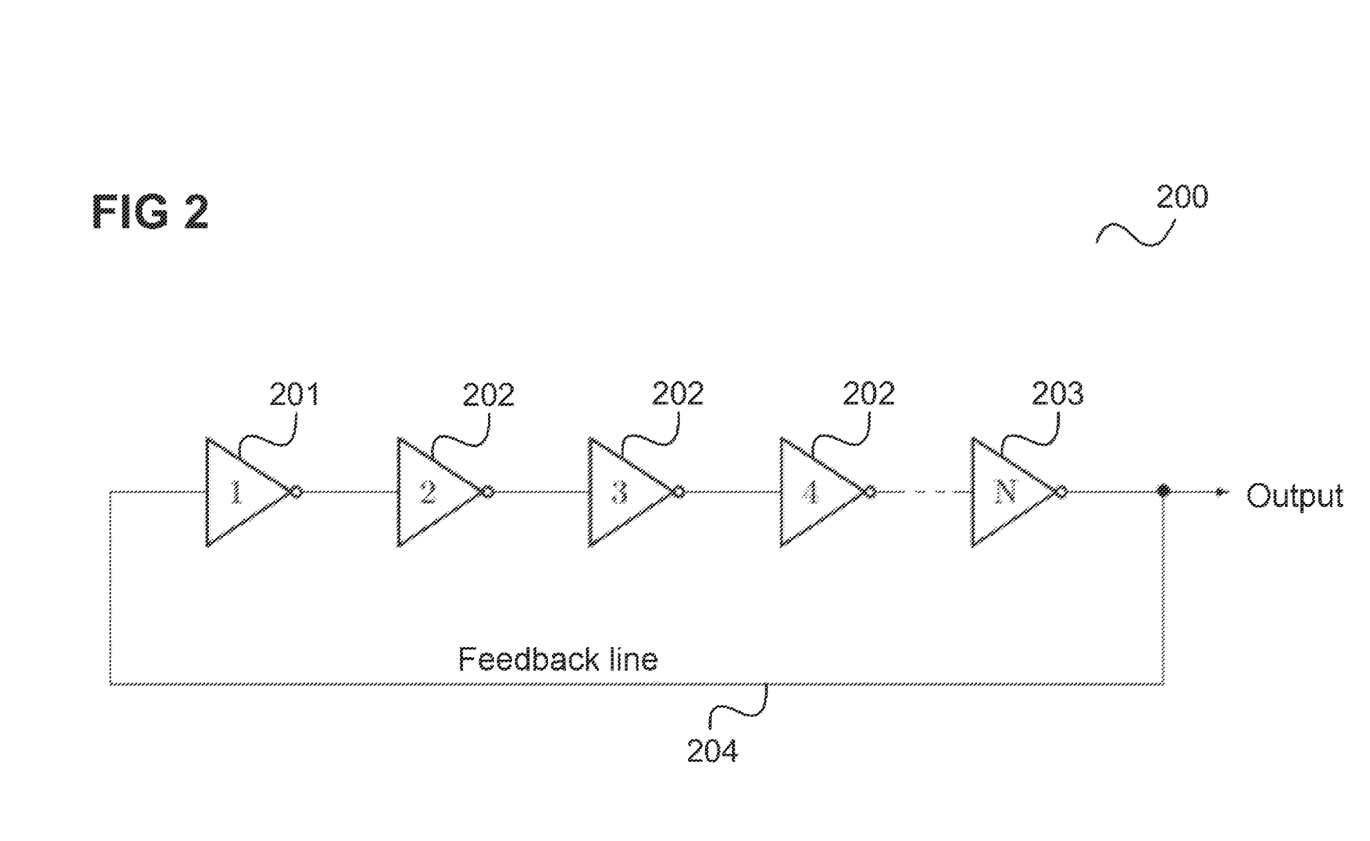
FIG. 2 shows a ring oscillator.

FIG. 2 shows a ring oscillator 200.

The ring oscillator 200 comprises a chain of logic gates 201, 202, 203 (generally cells) connected in series. Each logic gate 201, 202, 203 comprises an input connection and an output connection using by which each gate is interconnected in the chain, wherein the output connection of the last logic gate 203 of the chain is connected to the input connection of the first logic gate 201 via a feedback line (or feedback connection) 204. The other input connections of the logic gates 201, 202, 203 (for example the second input connection of a NAND gate or the second input connection of a NOR gate), subsequently referred to as side input connections, are set to a fixed value so that each logic gate 201, 202, 203 forms an inverter with respect to the input connection and output connection by which each gate is interconnected in the chain. If the number of logic gates N is uneven, the chain thus has an overall inverting effect and the loop formed by the feedback line 204 together with the chain oscillates.

The inputs for the side input connections of the logic gates 201, 202, 203 that cause them to function as inverters are referred to as side inputs. The side inputs together form a side input pattern. The side inputs are supplied by scan flip-flops 103 that are suitably loaded (through storage of a suitable test pattern that contains the side input pattern in the scan flip-flops). If it is not possible for a gate with a suitable side input to be made to function as an inverter (for example an AND gate), the side input is selected so that it has a non-inverting effect (that is to say simply as a buffer) and either the number of logic gates 201, 202, 203 is adjusted for an inverter is provided in the feedback line, with the result that an inverting response results again overall and the loop oscillates.

The frequency of this oscillation, that is to say the oscillation frequency of the ring oscillator in this way, can be observed and used to test performance of the integrated circuit 100. The quality of the testing depends on the information content of the oscillation frequency of the ring oscillator 100, that is to say it must represent the timing behavior of the entire chip as much as possible. However, the oscillation frequency typically correlates well with the performance of the integrated circuit, in particular when the chain of logic gates that is formed corresponds well to the design of the chip. Nevertheless, a high number of ring oscillators is typically required.

The ring oscillator described with reference to FIG. 2 is what is known as a functional ring oscillator, that is to say it is formed as mentioned above from logic gates 101 that are present in the integrated circuit (for the normal functioning thereof, that is to say normal operation in contrast to test operation). This prevents the ring oscillators leading to additional outlay in terms of area and energy, as is the case when they are formed from additional logic gates (that is to say not from logic gates that are present anyway).

Figure 3:
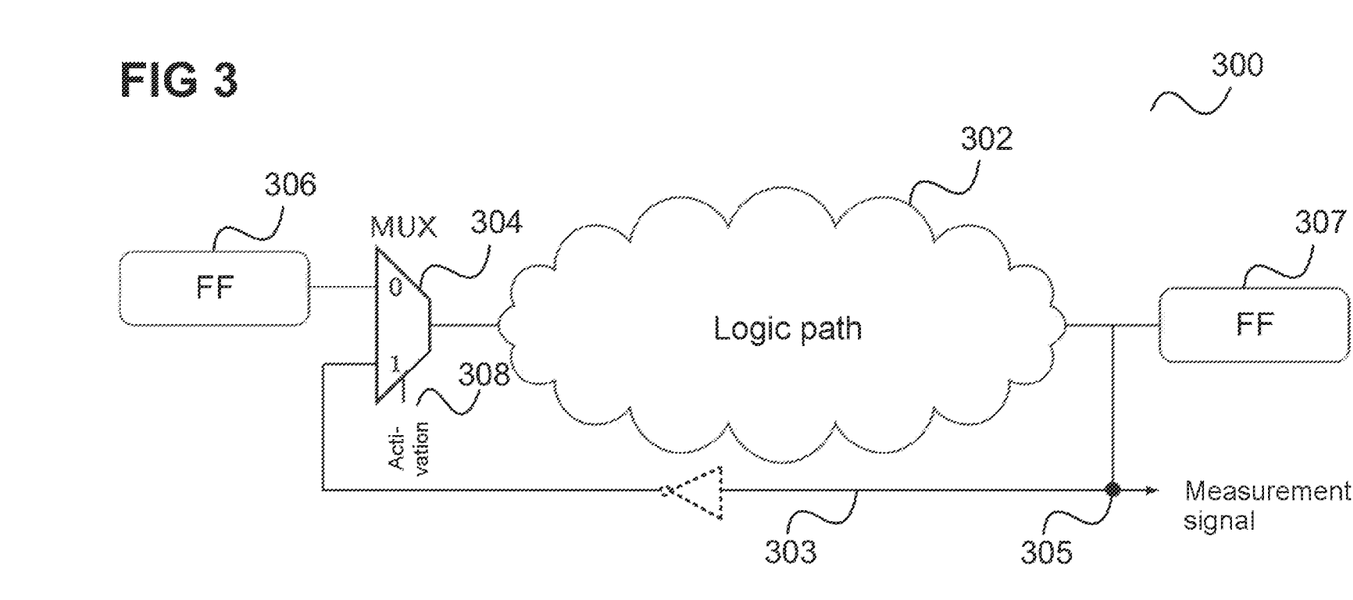
FIG. 3 shows a circuit for forming a functional ring oscillator in an integrated circuit.

FIG. 3 shows a circuit for forming a functional ring oscillator in an integrated circuit.

As is described with reference to FIG. 2, a combinational logic path 302 is formed by a chain of logic gates that are suitably supplied with side inputs. The feedback is effected via a feedback line 303 (which is provided with an inverter if the combinational logic path 302 is not self-inverting) that is connected to an input connection of an (input) multiplexer 304.

As explained above, the basic idea of a functional ring oscillator can be considered that of using a functional combination of logic path 302 that is present for the normal functioning of the integrated circuit (that is to say as per design) in order to form the ring oscillator.

The multiplexer 304 at the input connection of the path makes it possible to switch over from the functional mode (that is to say the use of the logic path 302 for normal operation, in this case input "0" of the multiplexer) to the oscillation mode in which the multiplexer 304 feeds the signal of the feedback line to the logic path 302 (in this case input "1" of the multiplexer 304). For normal operation, the multiplexer 304 connects for example an input signal from an input-side flip-flop 306 (that may also be from a memory or register) through to the logic path 302. The output of the logic path 302 goes to an output-side flip-flop 307 (for example of a memory or register). The input-side flip-flop 306 is also referred to as a launch flip-flop.

The oscillation frequency of the ring oscillator can be observed via a measurement terminal 305.

As explained above, suitable side inputs are applied to the logic gates that form the logic path 302 in order to form the logic path 302. To this end, an industrial automatic test pattern generation (ATPG) tool can be used in path delay mode. The ATPG tool is executed on a test apparatus (that is to say a test computer) and provides test patterns to the integrated circuit via the test pin 102. The ATPG tool thus sensitizes the logic path 302 by setting all side input to stable values.

In this way, the testing by means of functional ring oscillators can be easily integrated into a conventional industrial test procedure by applying design for testing (DFT) methods.

The functional ring oscillators represent the actual chip behavior well without producing much overhead in terms of area. Only the multiplexer 304 and the feedback line 303 are additionally required to form the ring oscillator.

However, in the example of FIG. 3, the functional ring oscillator has to be activated by an individual, central control signal 308 ("enable" signal) that is fed in the integrated circuit to the multiplexer 304. This control signal is individual for the functional ring oscillator since not all of the ring oscillators are to be activated at the same time during testing. There is therefore a high degree of routing outlay in this procedure. The control signal 308 has to be rooted transversely across the chip and microcontrollers are typically very discerning in terms of routing. Furthermore, the observation signal has to be conducted to a General Purpose Input/Output (GPIO) pin from the output connection 305 for frequency measurement via the chip.

Given few ring oscillators on a chip, the routing outlay plays a minor role. On account of process variation, in particular variation within a chip, in modern CMOS technologies, however, a lot of test structures distributed across the chip are required in order to cover the fluctuations on account of process variations and to detect the overall performance of the chip. The addition of hundreds of ring oscillators on a chip creates a high degree of routing outlay, however. Furthermore, the test duration has to be low in order to reduce the test costs.

Finally, there is a compromise between the number of test structures (that is to say in this case the ring oscillators), and the high degree of routing outlay for the test structures.

Other technologies such as slack monitors and shadow flip-flops that attempt to track and identify timing infringements in potentially time-critical paths lead to a huge overhead in terms of area since a high number of potentially critical paths have to be tracked.

Various embodiments provide approaches that reduce the routing outlay of functional ring oscillators. Specifically, self-activation of the functional ring oscillators is provided.

As explained above, a logic path 302 is sensitized by means of an ATPG tool by virtue of the ATPG tool setting all of the side inputs of the logic gates that form the logic path 302 to a static value. This sensitization is carried out by means of a robust path delay pattern that is loaded (for example shifted) from the ATPG tool into a set of scan flip-flops.

As explained above, the ring oscillator oscillates when the multiplexer connects through the signal of the feedback line 303. According to various embodiments, this is done by the launch flip-flop 306 so that self-activation is achieved.

Figure 4:
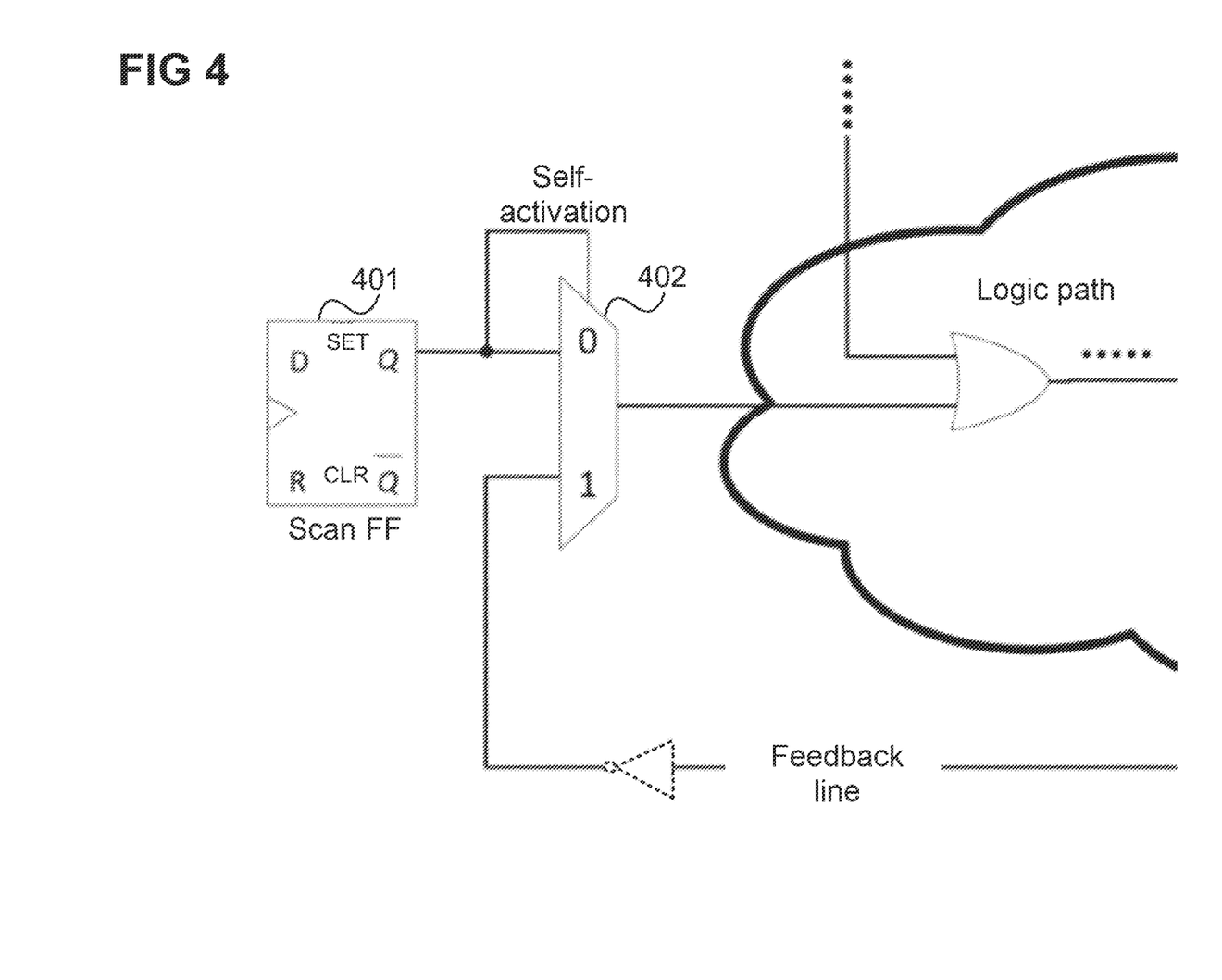
FIG. 4 shows the self-activation of a ring oscillator by way of a launch flip-flop.

FIG. 4 shows the self-activation of a ring oscillator by way of a launch flip-flop 401.

The launch flip-flop 401 is a scan flip-flop and corresponds to the launch flip-flop 306. The output connection thereof is connected not only to an input connection of a multiplexer 402 that corresponds to the multiplexer 304 but also to the control input connection thereof.

In this example, the control input must be set to logic 1 in order for the ring oscillator to be activated (that is to say to begin to oscillate). The test pattern for the scan flip-flop is selected so that only the launch flip-flop of the ring oscillator that is intended to be activated is set to 1. The test pattern is selected so that the launch flip-flops of all of the other ring oscillators are set to 0. This restriction can be given to the ATPG tool before the test pattern generation for the sensitization. One embodiment also provides a general activation signal (see FIG. 5) in order to activate the test mode, similar to the scan enable signal. The general activation signal is the same for all ring oscillators and therefore does not need to be routed separately. This is for example a protected bit, which is required for safety-critical ASIL (automotive safety integrity level) applications.

Figure 5:
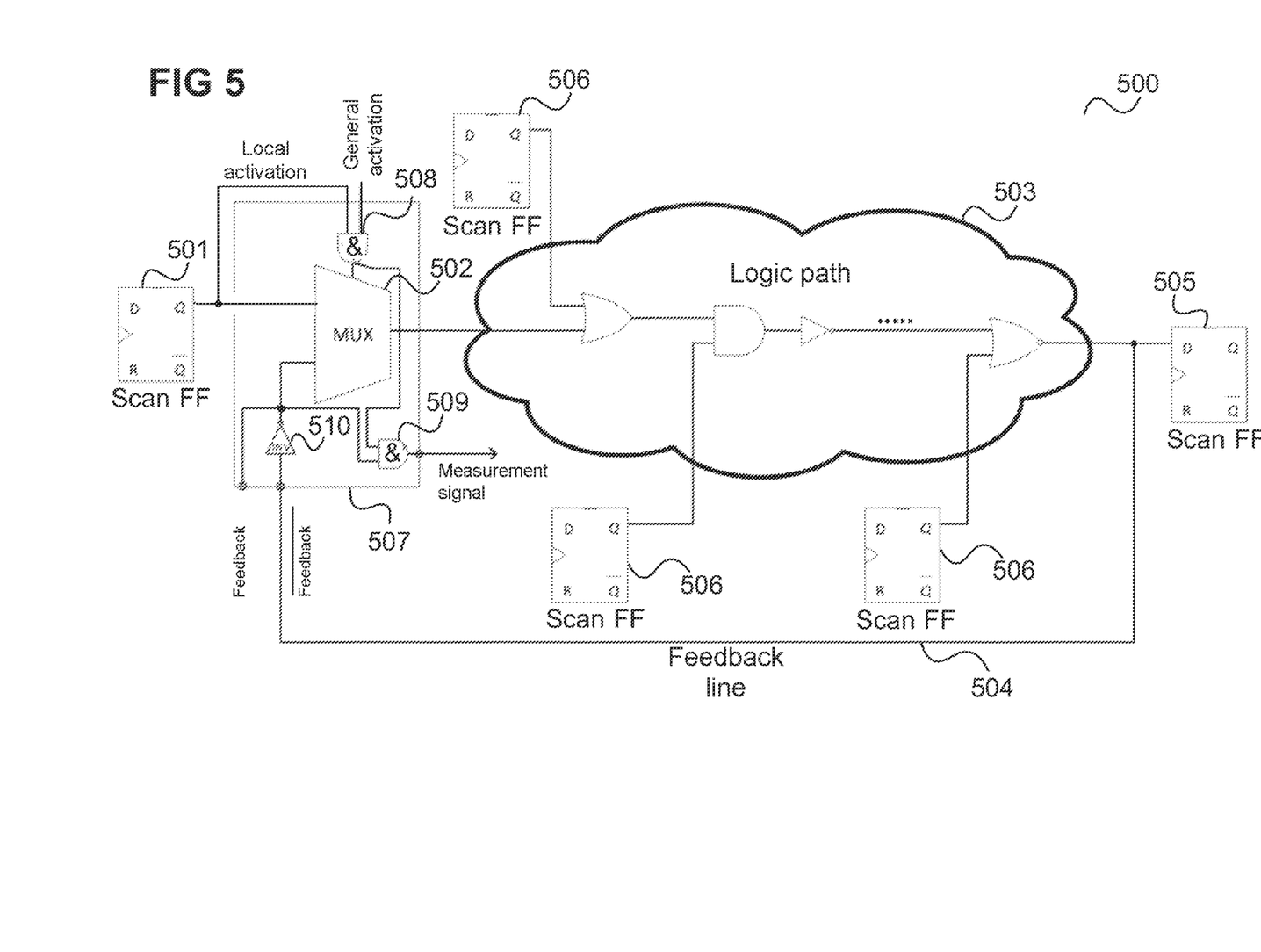
FIG. 5 shows a ring oscillator circuit with self-activation according to one embodiment.

FIG. 5 shows a ring oscillator circuit 500 with self-activation according to one embodiment.

As above with reference to FIG. 3 and FIG. 4, the ring oscillator circuit 500 contains a logic path 503, a launch flip-flop 501, a multiplexer 502, a feedback line 504, an output-side flip-flop 505 and further scan flip-flops 506 that supply the side inputs for the gates that form the logic path 503.

For example, a critical path in the (original) chip design is selected for the logic path 503. A requirement for the to logic path 503 is that it must be possible to sensitise it by means of a test pattern that is loaded into the (further) scan flip-flop 506.

As soon as the logic path has been selected, the functional ring oscillator can be produced. This can be done by means of an ECO (engineering change order). The ECO is executed by an incremental compilation run, produces the feedback line 504 and places an input circuit 507 containing the (2-to-1) multiplexer 502, a first AND gate 508, a second AND gate 509 and an inverter 510. The input circuit 507 can be inserted as a standard library cell with five terminals (input, output, feedback, inverted feedback, measurement).

The output connection of the launch flip-flop 501 is connected to the input connection of the input circuit 507. The output connection of the input circuit 507 is connected to the input connection of the logic path 503.

The output connection of the first AND gate 508 has to be in a high state (that is to say has to output a 1) in order to switch the multiplexer 502 from function mode (normal operation of the chip) to oscillation mode (test operation of the chip). An input terminal of the first AND gate 508 is connected to the input terminal of the input circuit 507 (which is connected to the output connection of the launch flip-flop 501). The general activation signal (general enable signal) is fed to the second input terminal of the first AND gate 508. The general activation signal is a protected bit that generally activates the function ring oscillator measurement.

Depending on the behavior of the logic path 503 (inverting or non-inverting), the feedback line 504 is applied via the regular feedback terminal or the inverting feedback terminal (connected downstream of the inverter 510) to the input connection of the multiplexer to which the 1 (that is to say the oscillation mode) is assigned at the control input connection in order to achieve overall an inverting behavior (and thus oscillation in the oscillation mode).

The second AND gate 509 is connected by way of its output connection to the measurement terminal at which the oscillation frequency of the ring oscillator can be measured.

When the multiplexer is switched to oscillation mode, the second AND gate 509 measures the oscillation frequency of the ring oscillator. The second AND gate 509 is optional. Whether it is provided depends on how the measurement signals of the ring oscillators are connected in order to provide them to a measurement pin (for example GPIO pin). The oscillation signal can be measured directly via the measurement pin or can be ascertained by means of an internal counter (frequency counter) and subsequently read out.

Figure 6:
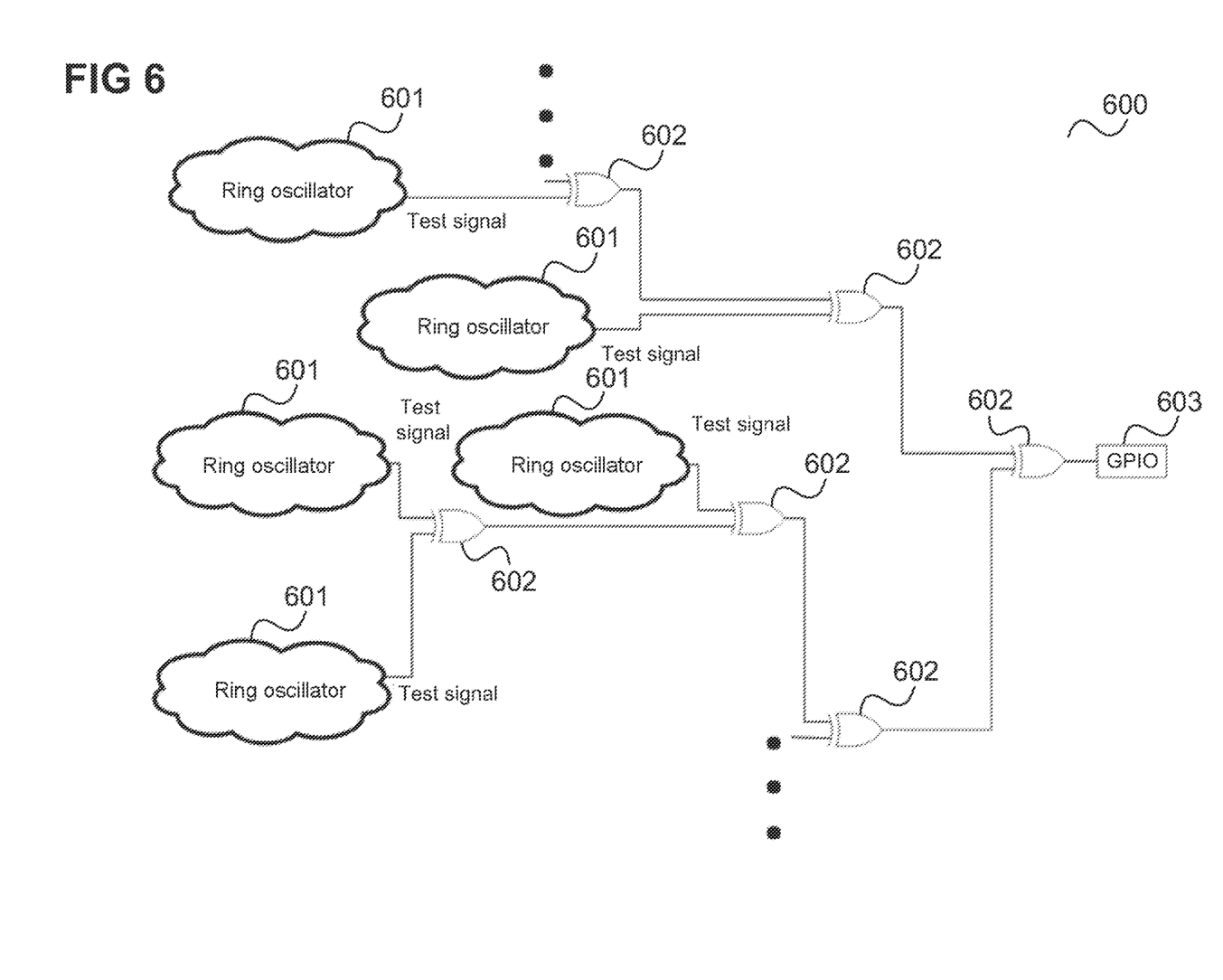
FIG. 6 shows an exclusive OR tree for collecting measurement signals of ring oscillators, wherein, when only one of these oscillates, the oscillation signal is fed to an output pin via exclusive OR gates.

If for example an exclusive OR tree is used to collect the measurement signals from the ring oscillators, the second AND gate 509 is not required.

FIG. 6 shows an exclusive OR tree 600 for collecting measurement signals of ring oscillators 601, wherein, when only one of these oscillates, the oscillation signal is fed to an output pin 603 via exclusive OR gates.

The second AND gate 509 ensures that only the input circuit 507 of a ring oscillator that is activated (that is to say the multiplexer 502 thereof is switched to oscillation mode) outputs a signal different from zero at the measurement terminal thereof. An OR tree can then also be used for example in order to collect the measurement signals.

In order to load the launch flip-flop 501 and the further scan flip-flops 506 for testing, an ATPG tool is used. For each ring oscillator for which a measurement is to be carried out, the ATPG tool generates a suitable test pattern that has a 1 or a 0, stored in the flip-flop for testing by means of the ring oscillator, for the scan flip-flops 103 of the integrated circuit (to which the launch flip-flop 501 and a further scan flip-flops 506 of each ring oscillator belong).

For the ring oscillator for which measurement is to be carried out, a 1 is stored in the launch flip-flop 501 and a 0 is stored in the launch flip-flops 501 of all of the other ring oscillators. The suitable side inputs are stored in the further flip-flops 506 for the ring oscillator for which measurement is to be carried out. That is to say that the ATPG tool accordingly generates the test pattern for measurement by means of a ring oscillator. These conditions for the test pattern can be set by ATPG restrictions in the tool environment. Each (functional) ring oscillator for a measurement can thus be activated by means of the ring oscillator by way of the configuration of the ATPG tool and the setting of the test pattern (provided the general activation signal is also active, in this example is at 1).

In the embodiment of FIG. 5, the output of the launch flip-flop 506 is fed to the multiplexer 502 and acts as a local activation signal (enable signal). In a further embodiment, the local activation signal is generated from a combination of output values from several scan flip-flops.

Figure 7:
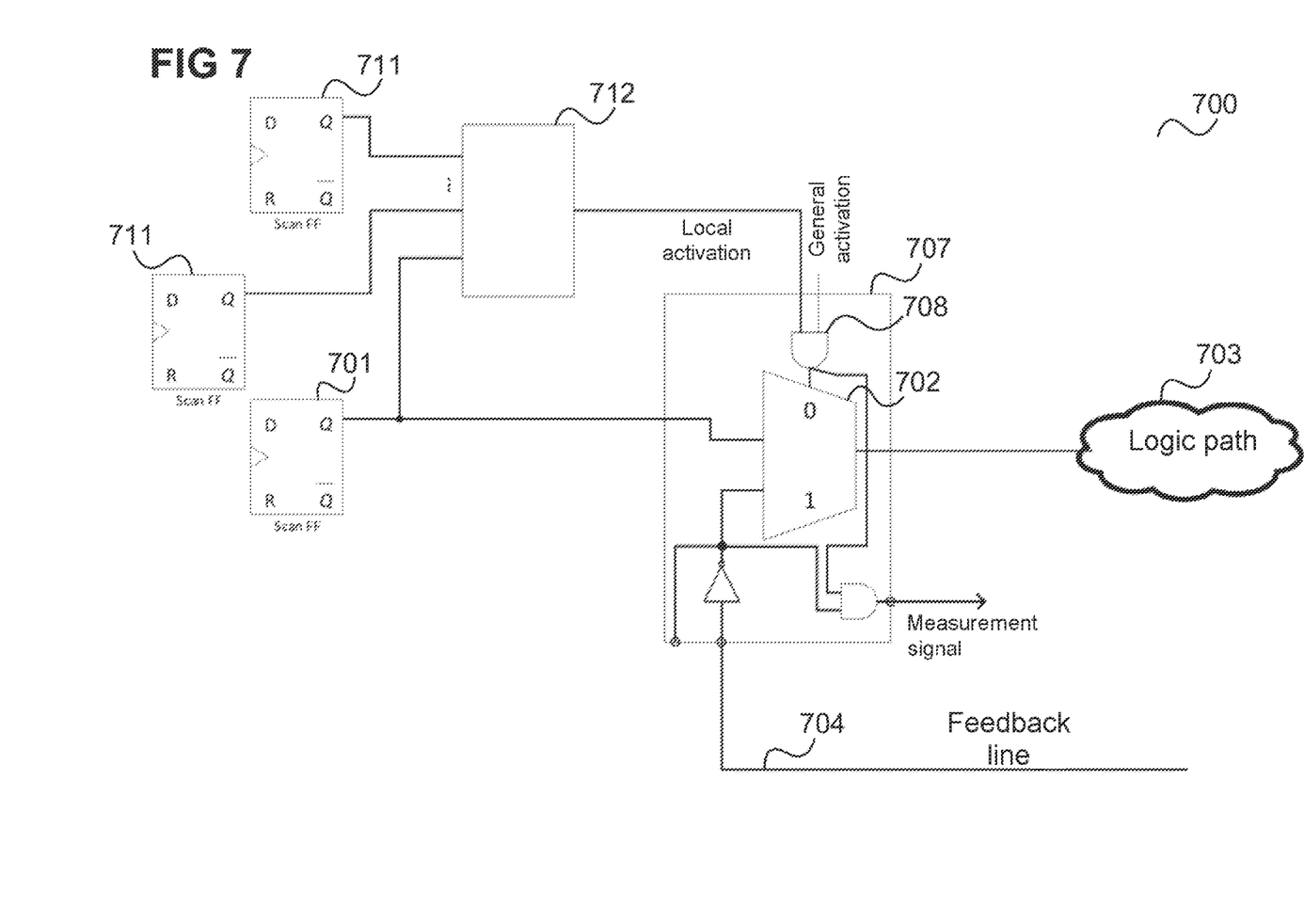
FIG. 7 shows a ring oscillator circuit with self-activation by way of the output of a plurality of scan flip-flops according to one embodiment.

FIG. 7 shows a ring oscillator circuit 700 with self-activation by way of the output of a plurality of scan flip-flops according to one embodiment.

Like the ring oscillator circuit 500 from FIG. 5, the ring oscillator circuit 700 contains a logic path 703, a launch flip-flop 701, a multiplexer 702, a feedback line 704 and an input circuit 707 with, inter alia, a (first) AND gate 708.

As in the example of FIG. 5, the AND gate 708 receives as input a general activation signal but as second input not the output of the scan flip-flop 701 but the output of a combination logic circuit 712 that receives the outputs of the launch flip-flop 701 and the outputs of further activation scan flip-flops 711. The further activation scan flip-flops 711 are also part of the scan flip-flops 103 of the integrated circuit 100. For example, these are scan flip-flops placed close to the logic path 703.

The values loaded into the launch flip-flop 701 and the values loaded into the further activation scan flip-flops 711 according to a test pattern determine the output of the combination logic circuit 712 and thus whether the ring oscillator is activated. When measurement is to be carried out by means of a ring oscillator, the test pattern is selected so that the output of the combination logic circuit 712 activates ring oscillator. The combination logic circuit 712 is constructed for example so that the pattern of the bits loaded into the launch flip-flop 701 and into the further activation scan flip-flop 711 is unambiguous. In order to test by means of a ring oscillator, the ATPG tool generates a test pattern that contains the pattern for the launch flip-flop 701 and the further activation scan flip-flop 711. The combination logic circuit 712 of the ring oscillator then outputs a local activation signal that activates the ring oscillator (provided the general activation signal is likewise active, wherein the AND gate 708 can also be attributed to the combination logic circuit 712, such that the output of the combination logic circuit 712 is actually the control input for the multiplexer 702). It should be noted that the launch flip-flop 701 does not necessarily have to supply one of the inputs of the combination logic circuit 712 but this may be provided.

The combination logic circuit 712 consists for example of standard logic cells that are adapted to the respective pattern. The combination logic circuit 712 can be scaled easily depending on the number of functional ring oscillators that are implemented and on the test architecture.

The embodiment of FIG. 7 can then be used for example when the degrees of freedom for the test pattern generation in the embodiment of FIG. 5 are too low. For example, it may be that a scan flip-flop that is the launch flip-flop for a ring oscillator that is currently not to be measured and therefore would have to be at 0 would have to supply a 1 has side input for another ring oscillator that is to be measured. In the exemplary embodiment of FIG. 7, this is possible without the flip-flop activating the ring oscillator whose launch flip-flop it is, since the states of another scan flip-flop can still be adopted in the local activation signal and be set accordingly.

The measurement signal is forwarded in the embodiment of FIG. 7 like in the embodiment of FIG. 5, for example via an exclusive OR tree or OR tree.

Both embodiments (FIG. 5 and FIG. 7) make it possible to significantly reduce the degree of routing outlay and carry out implementation in a scalable manner. The activation for the multiplexer 502, 702 from a central control circuit is no longer necessary.

Figure 8:
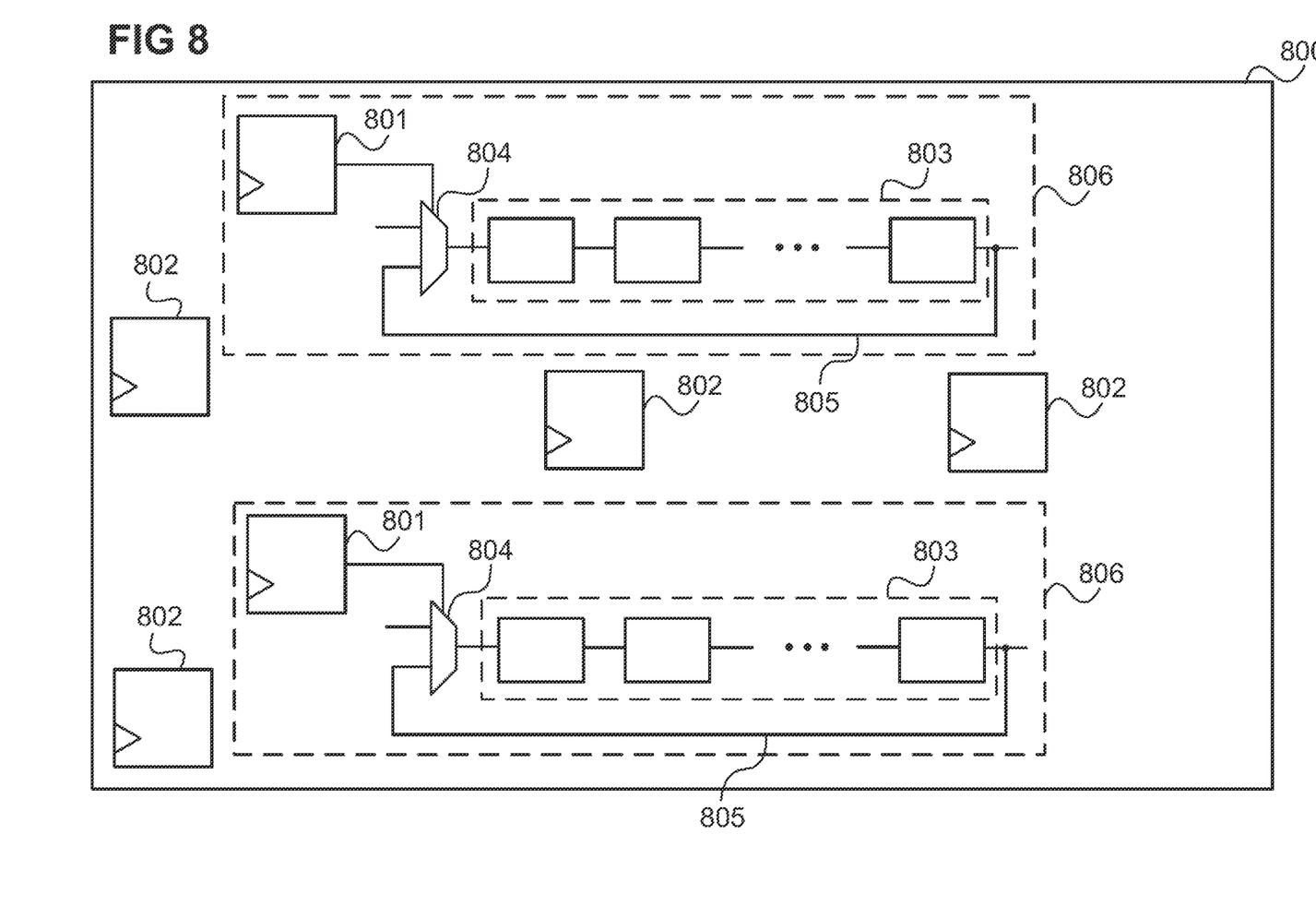
FIG. 8 shows an integrated circuit according to one embodiment.

In summary, various embodiments provide an integrated circuit (for example a chip), as is illustrated in FIG. 8.

FIG. 8 shows an integrated circuit 800 according to one embodiment.

The integrated circuit 800 comprises a multiplicity of scan flip-flops 801, 802.

The integrated circuit 800 also comprises a multiplicity of ring oscillators 806.

Each ring oscillator circuit 806 comprises a chain 803 of logic gates comprising a plurality of logic gates connected in succession, an input multiplexer 804 for the chain and a feedback line 805 from an output connection of the last logic gate of the chain to a data input connection of the input multiplexer 804.

Each ring oscillator circuit is assigned a scan flip-flop group that contains at least one scan flip-flop 801 of the multiplicity of scan flip-flops, wherein the input multiplexer 804 of the ring oscillator circuit is controlled depending on a bit stored by the at least one scan flip-flop 801 of the scan flip-flop group assigned to the ring oscillator circuit in such a way that the input multiplexer outputs the bit fed back via the feedback line 805 to the first logic gate of the chain 803 or that the input multiplexer outputs a bit that is to be processed by the chain 803 to the first logic gate of the chain 803.

The ring oscillator circuits are assigned different scan flip-flop groups, that is to say for each two of the ring oscillator circuits, the scan flip-flop groups assigned to the two ring oscillator circuits differ in at least one scan flip-flop (that is to say at least one scan flip-flop is only in one of the two groups).

In other words, a portion of the scan flip-flops present in a chip are used to activate ring oscillators, wherein different scan flip-flops are used to activate different ring oscillators. There is thus no need for a control connection to a central control device on the chip.

Using the approach from FIG. 8, it is therefore possible to achieve a massive reduction in the degree of routing outlay for functional ring oscillators and a fully scalable implementation of functional ring oscillators. Through the self-activation of functional ring oscillators, the number of ring oscillators on a chip is independent of a control structure on the chip.

According to one embodiment, the scan flip-flop is set by means of an ATPG tool. This enables a rapid test procedure and keeps the test costs low.

Various exemplary embodiments are stated below.

Exemplary embodiment 1 is an integrated circuit as described with reference to FIG. 8.

Exemplary embodiment 2 is an integrated circuit according to exemplary embodiment 1, wherein, for each ring oscillator circuit, the input multiplexer is switched depending on a general activation signal in such a way that it outputs the bit fed back via the feedback line to the first logic gate of the chain.

Exemplary embodiment 3 is an integrated circuit according to exemplary embodiment 1 or 2, wherein the scan flip-flops comprise data output connections and wherein each ring oscillator circuit is assigned a scan flip-flop group with exactly one of the multiplicity of scan flip-flops whose data output connection is connected to the control input connection of the input multiplexer of the chain of the ring oscillator in such a way that the one scan flip-flop, when it stores a predefined bit, switches the input multiplexer in such a way that it outputs the bit fed back via the feedback line to the first logic gate of the chain.

Exemplary embodiment 4 is an integrated circuit according to exemplary embodiment claim 3, wherein the data output connection or the data output connection of the one of the multiplicity of scan flip-flops complementary thereto is connected to a further data input connection of the input multiplexer.

Exemplary embodiment 5 is an integrated circuit according to exemplary embodiment 3 or 4, wherein the data output connection of the scan flip-flop is connected to the control input connection of the input multiplexer of the chain in such a way that it is combined with a general activation signal such that the one scan flip-flop, when it stores a predefined bit, switches the input multiplexer in such a way that it outputs the bit fed back via the feedback line to the first logic gate of the chain if the general activation signal is active.

Exemplary embodiment 6 is an integrated circuit according to exemplary embodiment 1 or 2, wherein the scan flip-flops comprise data output connections and wherein each ring oscillator circuit is assigned a scan flip-flop group with a plurality of the multiplicity of scan flip-flops whose data output connections are connected to the control input connection of the input multiplexer of the chain of the ring oscillator in such a way that the plurality of scan flip-flops, when they store the predefined bit combination, switch the input multiplexer in such a way that it outputs the bit fed back via the feedback line to the first logic gate of the chain, wherein the integrated circuit comprises a combination logic circuit via which the data output connections of the plurality of the multiplicity of scan flip-flops are connected to the control input connection of the input multiplexer.

Exemplary embodiment 7 is an integrated circuit according to exemplary embodiment 6, wherein the combination logic circuit is set up to combine the bits stored by the plurality of the multiplicity of scan flip-flops according to a predefined Boolean function to form a control bit for the input multiplexer and to supply same to the control input connection of the input multiplexer.

Exemplary embodiment 8 is an integrated circuit according to exemplary embodiment 6 or 7, wherein the plurality of the multiplicity of scan flip-flops comprise a scan flip-flop whose data output connection or whose data output connection complementary thereto is connected to a further data input connection of the input multiplexer.

Exemplary embodiment 9 is an integrated circuit according to any one of exemplary embodiments 6 to 8, wherein the data output connections of the plurality of the multiplicity of scan flip-flop is connected to the control input connection of the input multiplexer of the chain in such a way that they are combined with a general activation signal such that the plurality of scan flip-flops, when they store the predefined bit combination, switch the input multiplexer in such a way that it outputs the bit fed back via the feedback line to the first logic gate of the chain if the general activation signal is active.

Exemplary embodiment 10 is an integrated circuit according to any one of exemplary embodiments 1 to 9, wherein each ring oscillator circuit is assigned one or more further scan flip-flops of the multiplicity of scan flip-flops that are connected to the input connections of at least a portion of the logic gates of the chain of the ring oscillator circuit in such a way that, when they store a predefined side input pattern, the logic gates of the chain form a serial 1-bit logic path from an input connection of the first logic gate of the chain to the output connection of the last logic gate of the chain.

Exemplary embodiment 11 is an integrated circuit according to any one of exemplary embodiments 1 to 10, wherein the input multiplexer is a 2-to-1 multiplexer.

Exemplary embodiment 12 is an integrated circuit according to any one of exemplary embodiments 1 to 11, wherein, for each ring oscillator circuit, the scan flip-flops of the scan flip-flop group assigned to the ring oscillator circuit are placed closer to the ring oscillator circuit than the scan flip-flops of all of the other scan flip-flop groups.

Exemplary embodiment 13 is a test assembly for testing an integrated circuit according to any one of exemplary embodiments 1 to 12, comprising a test pattern generation circuit that is set up to generate for each ring oscillator circuit a respective test pattern that, when it is stored in the multiplicity of scan flip-flops, causes the input multiplexer of the ring oscillator circuit to output the bit fed back via the feedback line to the first logic gate of the chain of the ring oscillator circuit, and a test control device that is set up for each ring oscillator to feed the generated test pattern to the integrated circuit in such a way that the test pattern is stored in the multiplicity of scan flip-flops and to receive a measurement signal generated by the chain.

Exemplary embodiment 14 is a test assembly according to exemplary embodiment 13, comprising an analysis device that is set up to ascertain a performance of the integrated circuit from the oscillation frequencies of the measurement signals received for the chains.

Exemplary embodiment 15 is a method for testing an integrated circuit according to any one of exemplary embodiments 1 to 12, comprising: generating for each ring oscillator circuit a respective test pattern that, when it is stored in the multiplicity of scan flip-flops, causes the input multiplexer of the ring oscillator circuit to output the bit fed back via the feedback line to the first logic gate of the chain of the ring oscillator circuit; for each ring oscillator circuit feeding the generated test pattern to the integrated circuit in such a way that the test pattern is stored in the multiplicity of scan flip-flops; and receiving a measurement signal generated by the chain.

Exemplary embodiment 16 is a method according to exemplary embodiment 15, comprising ascertaining a performance of the integrated circuit from the oscillation frequencies of the measurement signals received for the chains.

Although the disclosure has been shown and described primarily with reference to specific embodiments, it should be understood by those familiar with the technical field that numerous modifications can be made with regard to configuration and details thereof, without departing from the essence and scope of the disclosure as defined by the claims hereinafter. The scope of the disclosure is therefore determined by the appended claims, and the intention is for all modifications to be encompassed which come under the literal meaning or the scope of equivalence of the claims.

What is claimed is:
1. An integrated circuit, comprising:
a multiplicity of scan flip-flops;

a multiplicity of ring oscillator circuits, wherein each ring oscillator circuit comprises:
  a chain of logic gates comprising a plurality of logic gates connected in succession;
  an input multiplexer for the chain; and
  a feedback line from an output connection of a last logic gate of the chain to a data input connection of the input multiplexer;
wherein each ring oscillator circuit is assigned a scan flip-flop group that contains at least one of the multiplicity of scan flip-flops, wherein the input multiplexer of the ring oscillator circuit is controlled depending on a control bit stored by the at least one of the multiplicity of scan flip-flops of the scan flip-flop group assigned to the ring oscillator circuit in such a way that the input multiplexer outputs an output bit fed back via the feedback line to a first logic gate of the chain when the control bit is in a first state and that the input multiplexer outputs an input bit that is to be processed by the first logic gate of the chain when the control bit is in a second state; and
wherein the ring oscillator circuits are assigned different scan flip-flop groups.

2. The integrated circuit as claimed in claim 1, wherein, for each ring oscillator circuit, the input multiplexer is switched depending on a general activation signal such that the input multiplexer outputs the output bit fed back via the feedback line to the first logic gate of the chain.

3. The integrated circuit as claimed in claim 2, wherein the scan flip-flops comprise data output connections and wherein each ring oscillator circuit is assigned a scan flip-flop group with exactly one of the multiplicity of scan flip-flops whose data output connection is connected to a control input connection of the input multiplexer of the chain of the ring oscillator circuit such that when the one scan flip-flop stores a predefined bit, the one scan flip-flop switches the input multiplexer such that the input multiplexer outputs the output bit fed back via the feedback line to the first logic gate of the chain.

4. The integrated circuit as claimed in claim 3, wherein a data output connection of the one of the multiplicity of scan flip-flops or a data output connection of the one of the multiplicity of scan flip-flops complementary thereto is connected to a further data input connection of the input multiplexer.

5. The integrated circuit as claimed in claim 3, wherein a data output connection of the scan flip-flop is connected to the control input connection of the input multiplexer of the chain such that the data output connection is combined with a general activation signal such that when the one scan flip-flop stores the predefined bit, the one scan flip-flop switches the input multiplexer such that the input multiplexer outputs the output bit fed back via the feedback line to the first logic gate of the chain when the general activation signal is active.

6. The integrated circuit as claimed in claim 1, wherein the scan flip-flops comprise data output connections and wherein each ring oscillator circuit is assigned a scan flip-flop group with a plurality of the multiplicity of scan flip-flops whose data output connections are connected to a control input connection of the input multiplexer of the chain of the ring oscillator circuit such that when the plurality of the multiplicity of scan flip-flops store a predefined bit combination, the plurality of the multiplicity of scan flip-flops switch the input multiplexer such that the input multiplexer outputs the output bit fed back via the feedback line to the first logic gate of the chain, wherein the integrated circuit comprises a combination logic circuit via which the data output connections of the plurality of the multiplicity of scan flip-flops are connected to the control input connection of the input multiplexer.

7. The integrated circuit as claimed in claim 6, wherein the combination logic circuit is set up to combine bits stored by the plurality of the multiplicity of scan flip-flops according to a predefined Boolean function to form the control bit for the input multiplexer and to supply the control bit to the control input connection of the input multiplexer.

8. The integrated circuit as claimed in claim 7, wherein the plurality of the multiplicity of scan flip-flops comprise a scan flip-flop whose data output connection or whose data output connection complementary thereto is connected to a further data input connection of the input multiplexer.

9. The integrated circuit as claimed in claim 6, wherein the data output connections of the plurality of the multiplicity of scan flip-flops is connected to the control input connection of the input multiplexer of the chain such that the data output connections are combined with a general activation signal such that when the plurality of the multiplicity of scan flip-flops store the predefined bit combination, the plurality of the multiplicity of scan flip-flops switch the input multiplexer such that the input multiplexer outputs the output bit fed back via the feedback line to the first logic gate of the chain when the general activation signal is active.

10. The integrated circuit as claimed in claim 1, wherein each ring oscillator circuit is assigned one or more further scan flip-flops of the multiplicity of scan flip-flops that are connected to input connections of at least a portion of the logic gates of the chain of the ring oscillator circuit such that, when the one or more further scan flip-flops store a predefined side input pattern, the logic gates of the chain form a serial 1-bit logic path from an input connection of the first logic gate of the chain to the output connection of the last logic gate of the chain.

11. The integrated circuit as claimed in claim 1, wherein the input multiplexer is a 2-to-1 multiplexer.

12. The integrated circuit as claimed in claim 1, wherein, for each ring oscillator circuit, the scan flip-flops of the scan flip-flop group assigned to the ring oscillator circuit are placed closer to the ring oscillator circuit than the scan flip-flops of all of the other scan flip-flop groups.

13. A test assembly for testing the integrated circuit as claimed in claim 1, comprising:
  a test pattern generation circuit that is set up to generate for each ring oscillator circuit a respective test pattern that, when that test pattern is stored in the multiplicity of scan flip-flops, causes the input multiplexer of the ring oscillator circuit to output the output bit fed back via the feedback line to the first logic gate of the chain of the ring oscillator circuit, and a test control device that is set up for each ring oscillator to feed the test pattern to the integrated circuit such that the test pattern is stored in the multiplicity of scan flip-flops and to receive a measurement signal generated by the chain.

14. The test assembly as claimed in claim 13, further comprising:
  an analysis device that is set up to ascertain a performance of the integrated circuit from oscillation frequencies of the measurement signals received for the chains.

15. A method for testing the integrated circuit of claim 1, comprising:
  generating for each ring oscillator circuit a respective test pattern that, when that test pattern is stored in the multiplicity of scan flip-flops, causes the input multiplexer of the ring oscillator circuit to output the output bit fed back via the feedback line to the first logic gate of the chain of the ring oscillator circuit;

for each ring oscillator circuit feeding the test pattern to the integrated circuit such that the test pattern is stored in the multiplicity of scan flip-flops; and receiving a measurement signal generated by the chain.

16. An integrated circuit, comprising:

a first multiplexer comprising a first multiplexer input, a second multiplexer input, a first multiplexer output, and a first multiplexer control terminal;

a first scan flip-flop having a first scan flip-flop input and a first scan flip-flop output, the first scan flip-flop output coupled to the first multiplexer input;

a second scan flip-flop having a second scan flip-flop input coupled to the first multiplexer output; and a first logic path extending between the first multiplexer output and the second scan flip-flop input, the first logic path including a first plurality of logic gates connected in succession and including a first leading logic gate and a first last logic gate, the first leading logic gate having a first leading logic gate input coupled to the first multiplexer output, and the first last logic gate having a first last logic gate output coupled to the second multiplexer input via a first feedback line.

17. The integrated circuit of claim 16, further comprising:

a local activation path coupling the first scan flip-flop output to the first multiplexer control terminal.

18. The integrated circuit of claim 16, wherein when a control signal provided to the first multiplexer control terminal is in a first state, the plurality of first logic gates are configured to provide a ring oscillator function such that an input signal received at the first leading logic gate input is inverted with respect to an output signal provided at the first last logic gate and a feedback signal on the first feedback line oscillates in time according to a frequency that evidences process variation on the integrated circuit.

19. The integrated circuit of claim 18, wherein when the control signal provided to the first multiplexer control terminal is in a second state, the first plurality of logic gates are configured to perform a logic function that is not the ring oscillator function.

20. The integrated circuit of claim 16, further comprising:

a second multiplexer comprising a third multiplexer input, a fourth multiplexer input, a second multiplexer output, and a second multiplexer control terminal;

a third scan flip-flop having a third scan flip-flop input and a third scan flip-flop output, the third scan flip-flop output coupled to the third multiplexer input;

a fourth scan flip-flop having a fourth scan flip-flop input coupled to the second multiplexer output; and a second logic path extending between the second multiplexer output and the fourth scan flip-flop input, the second logic path including a second plurality of logic gates connected in succession and including a second leading logic gate and a second last logic gate, the second leading logic gate having a second leading logic gate input coupled to the second multiplexer output, and the second last logic gate having a second last logic gate output coupled to the fourth multiplexer input via a second feedback line;

wherein the first and second scan flip-flops are assigned to a first scan flip-flop group and the third and fourth scan flip-flops are assigned to a second scan flip-flop group that differs from the first scan flip-flop group.

* * * * *